United States Patent [19]
Fujii

[11] Patent Number: 5,303,279
[45] Date of Patent: Apr. 12, 1994

[54] TIMER CIRCUIT

[75] Inventor: Takeshi Fujii, Hyogo, Japan

[73] Assignee: Mitsubishi Denki Kabushiki Kaisha, Tokyo, Japan

[21] Appl. No.: 13,453

[22] Filed: Feb. 4, 1993

[30] Foreign Application Priority Data

Feb. 6, 1992 [JP] Japan ................................. 4-056274

[51] Int. Cl.⁵ ............................................. H03K 21/08
[52] U.S. Cl. ......................................... 377/51; 377/56; 307/603
[58] Field of Search ............... 377/51, 56, 54, 75, 377/60, 59; 307/603, 608, 590, 592, 593, 597

[56]  References Cited
U.S. PATENT DOCUMENTS

| | | | |
|---|---|---|---|
| 3,890,490 | 6/1975 | Bnenger | 377/56 |
| 4,413,350 | 11/1983 | Bond et al. | 377/56 |
| 4,584,494 | 4/1986 | Arakawa et al. | 307/608 |
| 4,713,832 | 12/1987 | Hutson | 377/51 |

OTHER PUBLICATIONS

M37702M2-XXXFB Single-Chip 16-Bit CMOS Microcomputer Databook, Mitsubishi Electric, pp. 2-22, 2-23.

Primary Examiner—William L. Sikes
Assistant Examiner—My-Trang Nu Ton
Attorney, Agent, or Firm—Townsend and Townsend Khourie and Crew

[57]  ABSTRACT

An n-bit input count value is split into high-order $n-1$ bits and a low-order one bit so that the overflow signal 3a of the $n-1$ bit counter 2 for counting the high-order $n-1$ bits and the output signal 4a which is obtained by delaying the overflow signal 3a by half the cycle of the input clock by means of the delay circuit 4 are switched by the switch circuit 5 according to the low-order bit stored in the 1-bit register 6 to achieve a signal having a minimum decomposition width which is half the cycle of the input clock 7a.

7 Claims, 7 Drawing Sheets

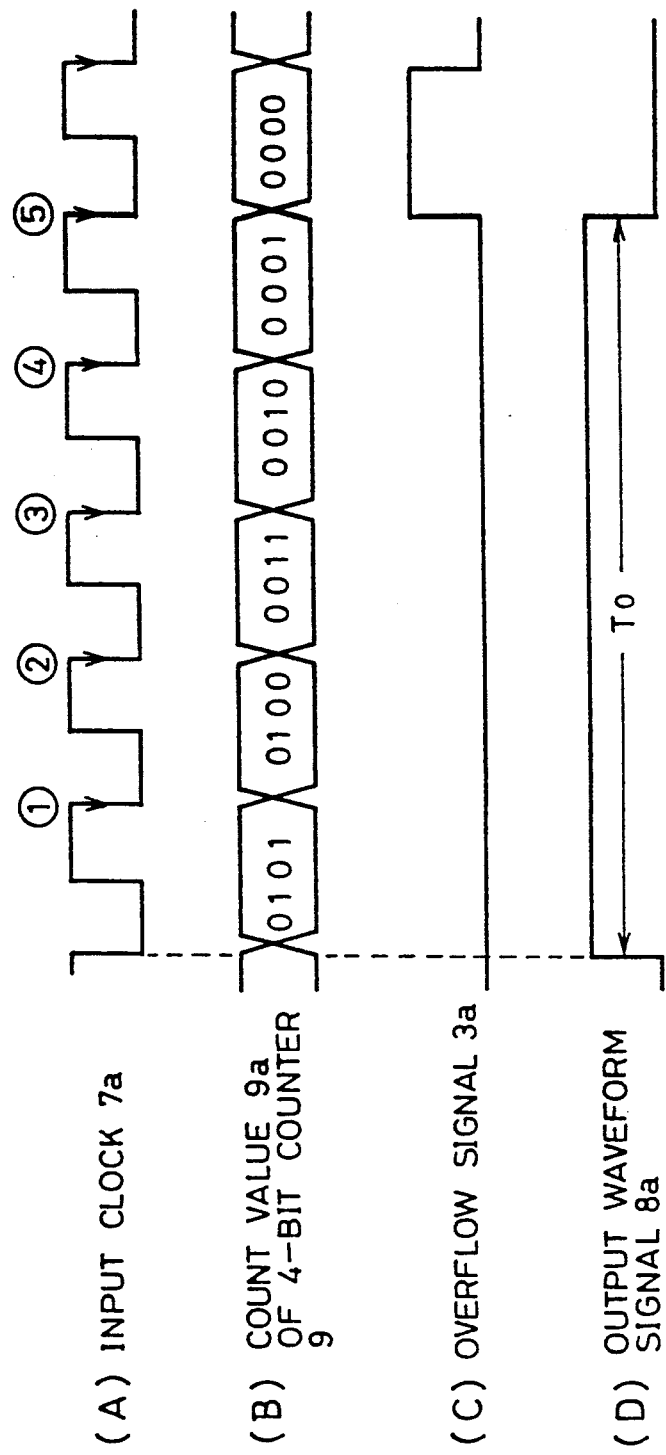

TIMER CIRCUIT

BACKGROUND OF THE INVENTION

1. Field of the Invention

The present invention relates to a timer circuit which counts a set input count value (digital data) in response to an input clock to output an overflow signal or a waveform signal at a time corresponding to the input count value.

2. Description of the Prior Art

Generally speaking, a timer circuit consists of an n-bit counter for counting an n-bit input count value in response to an input clock and an overflow detection circuit for detecting an overflow of this counter to output an overflow signal. A timer circuit having a waveform output function comprises a waveform generator circuit responsive to the overflow signal to output a waveform signal which changes from "1" to "0" or "0" to "1", in addition to the above-mentioned elements. The timer circuit having the waveform output function is structured as shown in FIG. 6. In the figure, reference numeral 1 represents a data bus, 3 an overflow detection circuit, 8 a waveform generator circuit, 9 an n-bit counter, 1a an n-bit input count value, 3a an overflow signal, 7a an input clock, 8a an output waveform signal, and 9a a count value. A timer circuit without a waveform output function is not provided with a waveform generator circuit 8. The n-bit counter 9 receives the n-bit input count value 1a from the data bus 1 and counts the value in response to the input clock 7a. Then, the n-bit counter 9 outputs the count value 9a to the overflow detection circuit 3. The overflow detection circuit 3 detects an overflow of the n-bit counter 9 from the count value 9a and outputs the overflow signal 3a to the waveform generator circuit 8, which is responsive to the overflow signal 3a to output the output waveform signal 8a which changes from "1" to "0" or from "0" to "1".

FIG. 7 is a waveform diagram illustrating the operation of the conventional timer circuit (same structure as that of FIG. 6) in the case of a 4-bit input count value. In the figure, reference letter (A) represents the waveform of the input clock 7a of the n-bit counter 9 (4-bit counter), (B) the count value 9a of the 4-bit counter 9, (C) the waveform of the overflow signal 3a from the overflow detection circuit 3, and (D) the waveform of the output waveform signal 8a from the waveform generator circuit 8. Next, the operation of the conventional timer circuit (4-bit timer circuit) will be described with reference to FIG. 6 and FIG. 7. A timer value "5" ("0101" in binary code) is first set to the 4-bit counter 9 from the data bus 1. The 4-bit counter 9 counts the timer value "5" upon a fall in the input clock 7a. When the 4-bit counter 9 counts "1" ("0001" in binary code) and "0" ("0000" in binary code), it outputs the count value 9a of "0" to the overflow detection circuit 3. The overflow detection circuit 3 detects an overflow from the count value 9a of "0" and outputs the overflow signal 3a to the waveform generator circuit 8. When the waveform generator circuit 8 has received the overflow signal 3a, it outputs the output waveform signal 8a having a cycle T0 and whose waveform is changed from "1" to "0". The waveform of this output waveform signal 8a has been changed from "0" to "1" at the start of counting by the 4-bit counter 9.

This timer circuit has a minimum decomposition width which is based on the input clock and is decreasing with advances in technology. The reason for this is that when the minimum decomposition width of the timer circuit is reduced, the accuracy, for example, of the overflow signal generated from the counter can be improved. In addition, when the timer having a small minimum decomposition width is used in a power control circuit of a PWM control system, voltage generated from a power supply can be finely controlled. Therefore, in order to achieve these advantages, the frequency of the source input clock must be raised to reduce the minimum decomposition width of the conventional timer circuit.

As described in the foregoing, in the conventional timer circuit, the 4-bit counter 9 counts a set count value upon each fall in the input clock. Therefore, the point where the overflow signal 3a is generated from the overflow detection circuit 3 coincides with the cycle of the input clock 7a (1 to 5 in (A) of FIG. 7), and the minimum decomposition width of the overflow signal coincides with the input clock 7a. Therefore, to reduce the minimum decomposition width, the input clock must be speeded up. In the conventional timer circuit having a waveform generation function, the overflow signal 3a ((c) of FIG. 7) triggers a change in the output waveform signal 8a from "1" to "0" or from "0" to "1". Therefore, the point where the output waveform signal 8a is changed coincides with the cycle of the input clock 7a like the overflow signal 3a. In other words, since the minimum decomposition width of the output waveform signal coincides with the input clock, the input clock must be speeded up to reduce the minimum decomposition width. In this way, in the conventional timer circuit, the input clock needs to be speeded up to reduce the minimum decomposition width, but when the frequency of the input clock is raised, the operation speed of circuit elements such as a transistor incorporated in a circuit needs to be increased. Therefore, the conventional timer has the problem that the entire device must be designed adjusted to the frequency of the input clock in addition to the development of circuit elements.

SUMMARY OF THE INVENTION

It is an object of the present invention to provide a timer circuit which can reduce the minimum decomposition width of the above-mentioned overflow signal and the output waveform signal to half the cycle of the input clock.

As shown in FIG. 1, a timer circuit according to an embodiment of the present invention having an overflow detection circuit 3 for detecting an overflow of the counter to which a count value is set and for outputting an overflow signal comprises counter means (n−1 bit counter 2) provided before the above-mentioned overflow detection circuit 3 for counting high-order n−1 bits of the set n-bit input count value in response to a predetermined input clock, bit storage means (1-bit register 6) for storing a low-order one bit of the input count value, delay means (delay circuit 4) for delaying the overflow signal from the overflow detection circuit 3 by half the cycle of the input clock, and switch means (switch circuit 5) for selecting the overflow signal delayed by the delay means or the undelayed overflow signal from the overflow detection circuit 3 according to a value stored in the bit storage means and for outputting the selected signal.

As shown in FIG. 4, a timer circuit according to another embodiment of the present invention having an overflow detection circuit 3 for detecting an overflow of the counter to which a count value is set and for outputting an overflow signal comprises counter means (n−1 bit counter 2) provided before the above-mentioned overflow detection circuit 3 for counting high-order n−1 bits of the set n-bit input count value in response to a predetermined input clock, bit storage means (1-bit register 6) for storing a low-order one bit of the input counter value, waveform signal generator means (waveform generator circuit 8) for generating a predetermined waveform signal in response to the overflow signal from the overflow detection circuit 3, delay means (delay circuit 4) for delaying the waveform signal from the waveform signal generator means by half the cycle of the input clock, and switch means (switch circuit 5) for selecting the waveform signal delayed by the delay means or the undelayed waveform signal from the waveform generator circuit 8 according to a value stored in the bit storage means and for outputting the selected signal.

In the timer circuit according to the first embodiment of the present invention, high-order n−1 bits of an n-bit input count value is first set to the count means n−1 bit counter 2), and a low-order one bit of the input count value is stored in the bit storage means (1-bit register 6). The counter means counts high-order n−1 bits of the count value in response to the input clock, and the overflow detection circuit 3 detects an overflow of the above-mentioned counter means and outputs an overflow signal. The delay means (delay circuit 4) delays the overflow signal by half the cycle of the input clock and outputs the delayed signal. The switch means (switch circuit 5) receives the undelayed overflow signal from the overflow detection circuit 3 and the overflow signal delayed by the delay means and selects one of them according to a value stored in the bit storage means. Therefore, the minimum decomposition width where the above-mentioned overflow signal is generated can be reduced to half the cycle of the input clock.

In the timer circuit according to the second embodiment of the present invention, high-order n−1 bits of an n-bit input count value are first set to the counter means (n−1 bit counter 2), and a low-order one bit of the input count value is stored in the bit storage means (1-bit register 6). The counter means counts high-order n−1 bits of the input count value in response to the input clock, and the overflow detection circuit 3 detects an overflow of the counter means and outputs an overflow signal. The waveform output means (waveform generator circuit 8) outputs a predetermined waveform signal in response to the overflow signal. This waveform signal is delayed by the delay means (delay circuit 4) by half the cycle of the input clock for output. The switch means (switch circuit 5) receives the undelayed waveform signal from the waveform output means and the waveform signal delayed by the delay means, and selects one of them according to the value stored in the bit storage means for output. Therefore, the minimum decomposition width where the waveform signal is changed can be reduced to half the cycle of the input clock.

The above and other objects, features and advantages of the invention will become more apparent from the following description when taken in conjunction with the accompanying drawings.

BRIEF DESCRIPTION OF THE DRAWINGS

FIG. 7 is a waveform diagram illustrating the operation of each part of the timer shown in FIG. 6.

DESCRIPTION OF THE PREFERRED EMBODIMENT

Figure 1:
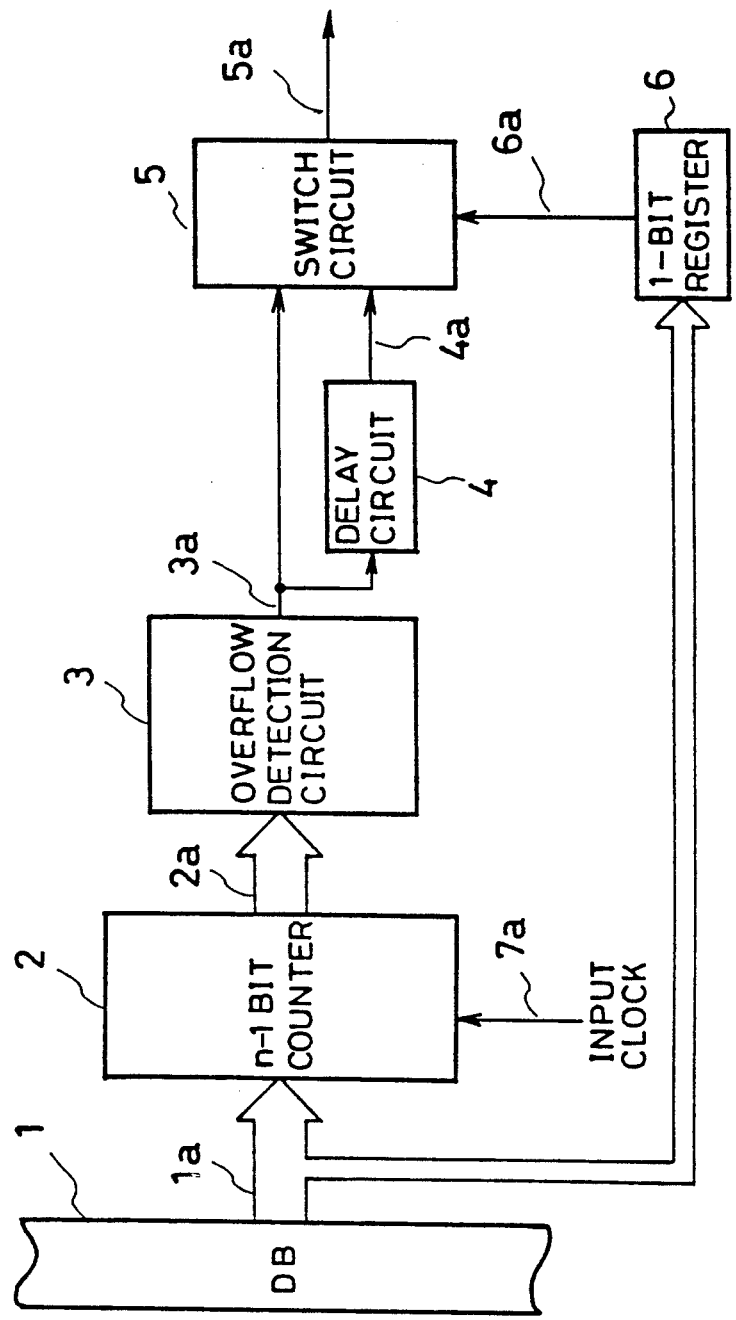
FIG. 1 is a block diagram of a timer circuit according to the first embodiment of the present invention.
Figure 6:
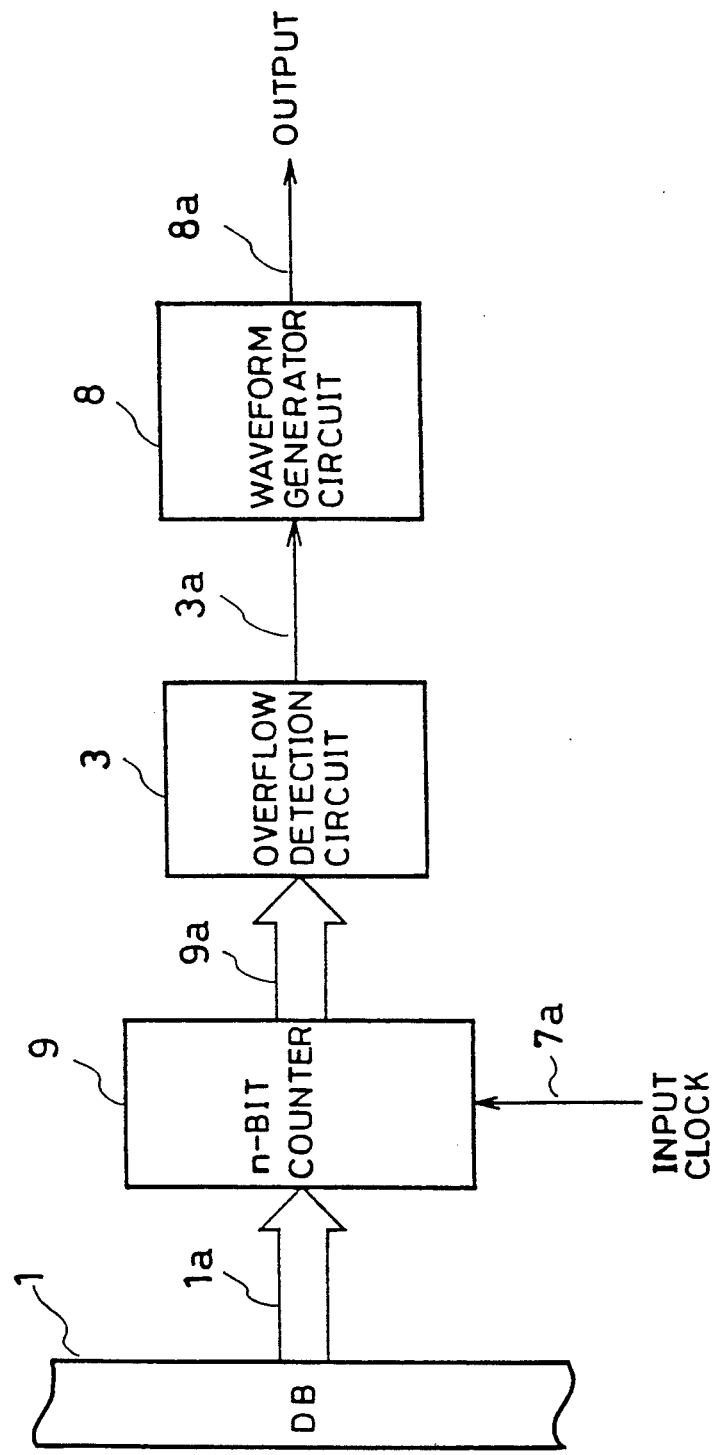
FIG. 6 is a block diagram of a conventional timer circuit.

Preferred embodiments of the present invention will be described with reference to the accompanying drawings. FIG. 1 is a block diagram of a timer circuit according to the first embodiment of the present invention. In the figure, reference numeral 1 represents a data bus, 2 an n−1 bit counter as counter means, 3 an overflow detection circuit, 4 a delay circuit as delay means, 5 a switch circuit as switch means, 6 a one-bit register as bit storage means, 1a an n-bit input count value inputted and set to the counter means, 2a a count value of the n−1 bit counter 2, 3a an overflow signal outputted from the overflow detection circuit 3, 4a an output signal from the delay circuit 4, 7a an input clock, and 6a a value stored in the one-bit register 6. In the figure, the reference symbols designate the same elements as those of FIG. 6, and their descriptions are omitted.

High-order n−1 bits of a split n-bit input count value 1a are set to the n−1 bit counter 2 which counts the high-order n−1 bits in response to the input clock 7a. For example, when a 4-bit input count value "0101" is inputted, high-order 3 bits "010" are separated from the value and set to the n−1 bit counter 2 for counting. In other words, the count value inputted from the data bus 1 is almost halved, and the half value is then counted by the n−1 bit counter 2 (3-bit counter 2 in case of a 4-bit input count value). The overflow detection circuit 3 detects an overflow of the counter 2 by detecting that the count value 2a of the n−1 bit counter 2 is "0", for example, and outputs the overflow signal 3a. The delay circuit 4 outputs the output signal 4a by delaying the overflow signal 3a by half the cycle of the input clock 7a (½T in case of a cycle T of the input clock). Meanwhile, the one-bit register 6 stores a low-order one bit of the n-bit input count value 1a, for example low-order one bit "1" of the count value "0101". The switch circuit 5 selects the overflow signal 3a or the output signal 4a according to a value stored in the one-bit register 6 ("1" in this case) and outputs the selected signal as the output signal 5a.

Figure 2:
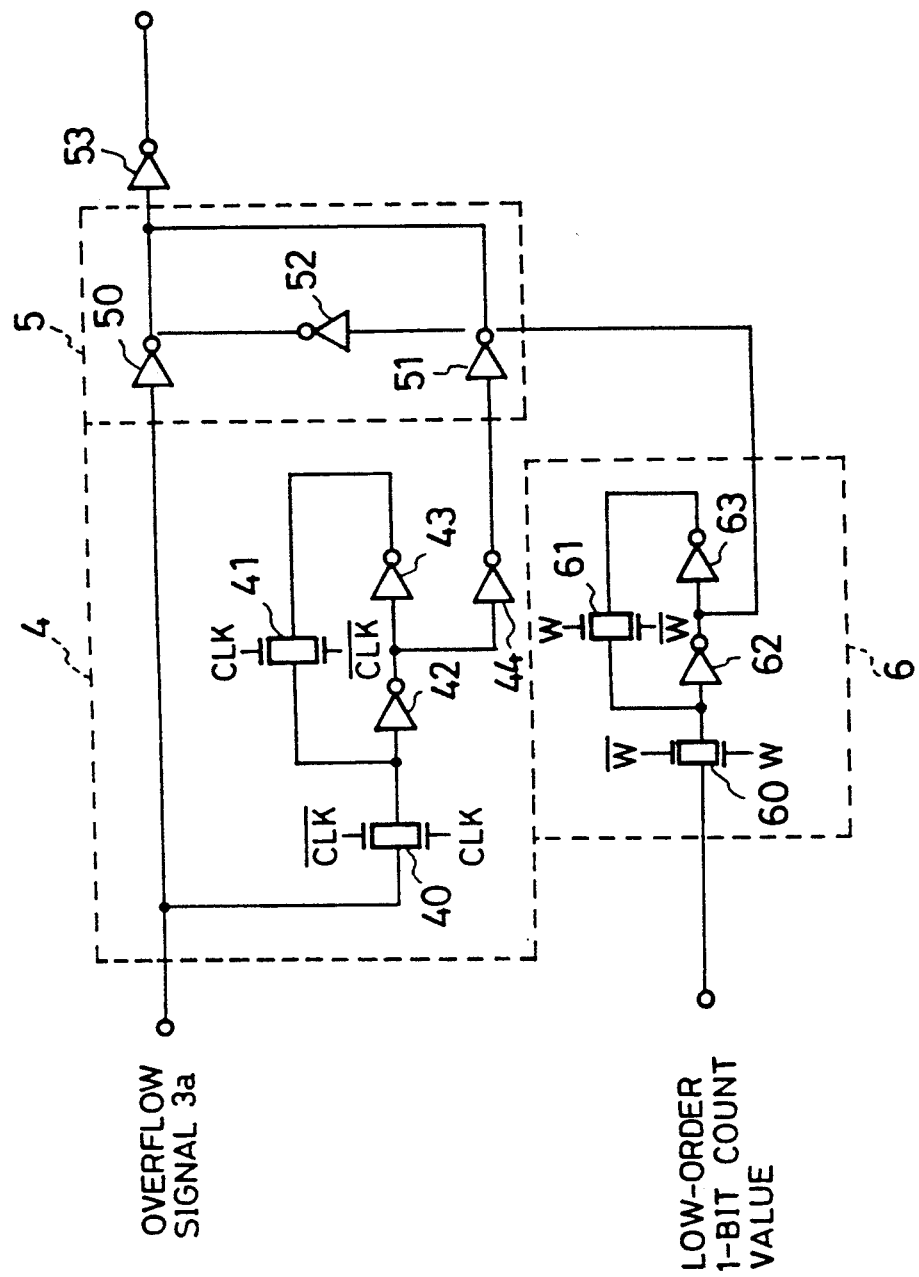
FIG. 2 is a circuit diagram illustrating the detail of the delay circuit, switch circuit and one-bit register shown in FIG. 1.

FIG. 2 is a circuit diagram illustrating each part of the first embodiment. In the figure, the delay circuit, switch circuit, and one-bit register of FIG. 1 are shown in detail. In the figure, reference numerals 40 and 41 represent transmission gates, 42 to 44 inverter circuits, 50 and 51 clocked inverters, 52 and 53 inverter circuits, 60 and 61 transmission gates, and 62 and 63 inverter circuits. The delay circuit 4 consists of the transmission gates 40 and 41 and the inverter circuits 42 to 44. The transmission gate 40 is turned on upon a rise in the input clock 7a at the control terminal CLK and the control terminal CLK (inverted) thereof to write data of the overflow signal 3a to the inverter circuits 42 and 43. At this time, the transmission gate 41 is turned off upon a rise in the input clock 7a at the control terminal CLK and the control terminal CLK (inverted) thereof, and turned on to latch written data at half the cycle of the next input clock when the transmission gate 40 is turned off. Then, new data of the overflow signal 3a are written to the inverter circuits 42 and 43 at half the cycle of the next input clock. As a result, the written data is delayed by half the cycle of the input clock. The one-bit register 6 consists of the transmission gates 60 and 61, and the inverter circuits 62 and 63. The transmission gate 60 is turned on upon a rise in write signal at the control terminal W (inverted) and the control terminal W thereof. The transmission gate 61 is turned on upon a fall in write signal at the control terminal W and the control terminal W (inverted) thereof. That is, the transmission gate 60 is turned on when the transmission gate 61 is turned off, and vice versa. To write data, the transmission gate 60 is turned on, and the transmission gate 61 is turned off. To latch data, the transmission gate 61 is turned on, and the transmission gate 60 is turned off. The switch circuit 5 consists of the clocked inverter circuits 50 and 51, and the inverter circuit 52. When a signal "1" is inputted into the inverter circuit 52, the inverter 50 is activated, and the inverter circuit 51 is inactivated so that the inverter circuit 50 is selected. When a signal "0" is inputted into the inverter circuit 52, the inverter circuit 50 is inactivated, and the inverter circuit 51 is activated so that the inverter circuit 51 is selected.

Figure 3:
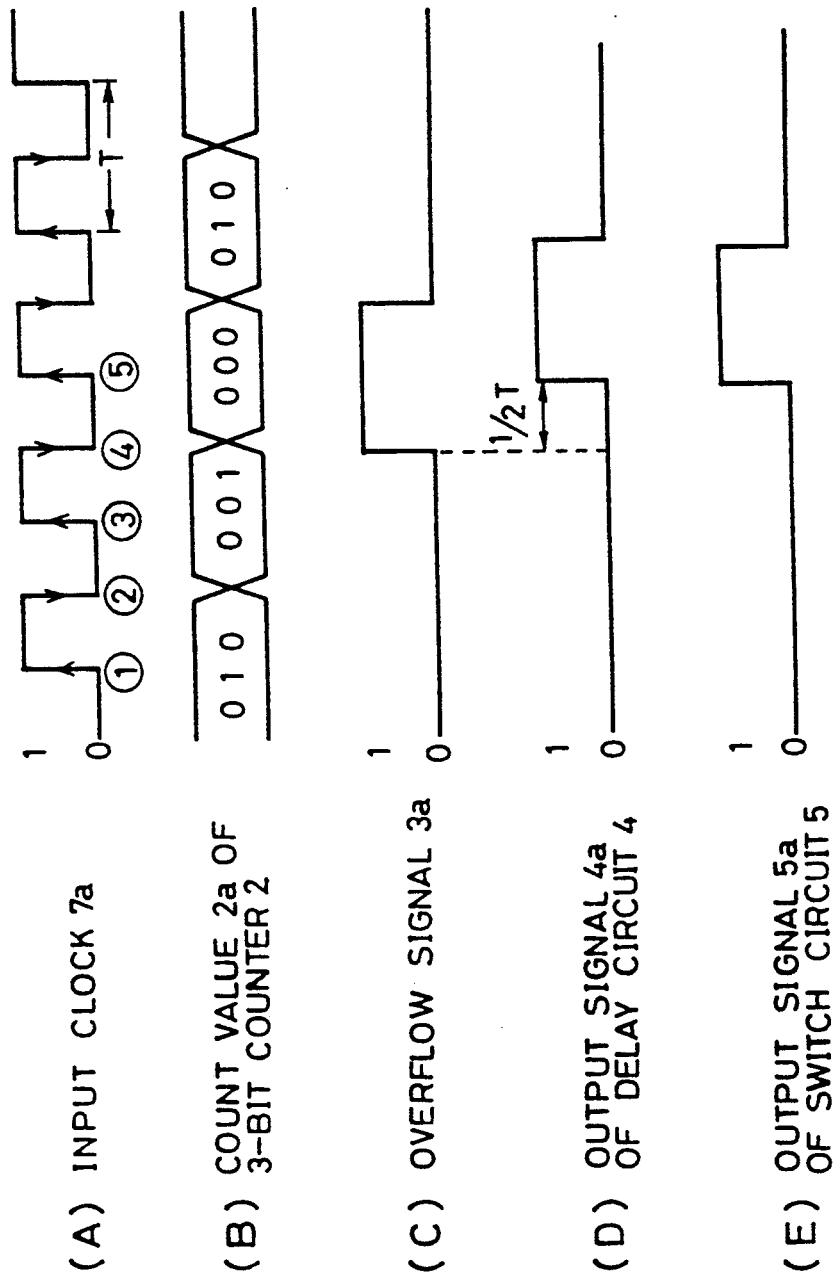
FIG. 3 is a waveform diagram illustrating the operation of each part of the timer circuit shown in FIG. 1.

FIG. 3 is a waveform diagram illustrating the operation of each part of this first embodiment when a 4-bit count value is inputted into the timer circuit. In the figure, reference letter (A) represents the input clock 7a having a cycle T and inputted into the the n−1 bit counter 2, 1 to 5 rises and falls in the input clock, (B) the count value 2a of the n−1 bit counter 2 (3-bit counter 2 in this case), (C) the overflow signal 3a from the overflow detection circuit 3, (D) the output signal 4a of the delay circuit 4, and (E) the output signal 5a of the switch circuit 5.

Next, with reference to FIGS. 1 to 3, the operation of the first embodiment will be described. A 4-bit input count value "0101" is first inputted from the data bus 1. This input count value "0101" is split into high-order n−1 bits (3 bits "010") and a low-order one bit (1 bit "1"). The 3-bits "010" are set to the n−1 bit counter 2 (3-bit counter 2), and the one bit "1" is stored in the 1-bit register 6. At this time, as shown in FIG. 2, the transmission gate 60 of the 1-bit register 6 is turned on and the transmission gate 61 is turned off by supplying write signals to the control terminal W and the control terminal W (inverted) of the transmission gate 60 in order to write data "0" which the one bit "1" has been inverted into by the inverter circuit 62. Thereafter, the clocked inverter 51 is activated for selection. Meanwhile, the 3-bit counter 2 counts 3 bits "010" in response to the input clock 7a ((A) of FIG. 3) and outputs the count value 2a ((B) of FIG. 3). The overflow detection circuit 3 detects a change in the count value from "001" to "000" (4 to 5 of (A) of FIG. 3) and outputs the overflow signal 3a (signal "1" of (C) of FIG. 3) to the switch circuit 5 or the delay circuit 4. In the delay circuit 4, as shown in FIG. 2, the transmission gate 40 is turned off and the transmission gate 41 is turned on to latch "0", but the transmission gate 40 is turned on and the transmission gate 41 is turned off after half the cycle T (4 to 5 of (A) of FIG. 3) of the input clock 7a to write "1" onto the inverter circuit 42 and latch "1" to the inverter circuits 42 to 44. As a result, the output signal 4a ((D) of FIG. 3) delayed by half the cycle T (1/2) of the input clock is outputted. Since the switch circuit 5 selects the output signal 4a as described in the foregoing, the circuit outputs the output signal 5a ((E) of FIG. 3) delayed by half the cycle T of the input clock 7a. As a result, in the timer circuit of this first embodiment, although the same count value "0101" is set, the overflow signal can be outputted at half the cycle of the input clock 7a, unlike the prior art FIG. 7). That is, the minimum decomposition width of the overflow signal can be reduced to half the cycle of the input clock without changing the frequency of the input clock.

Figure 4:
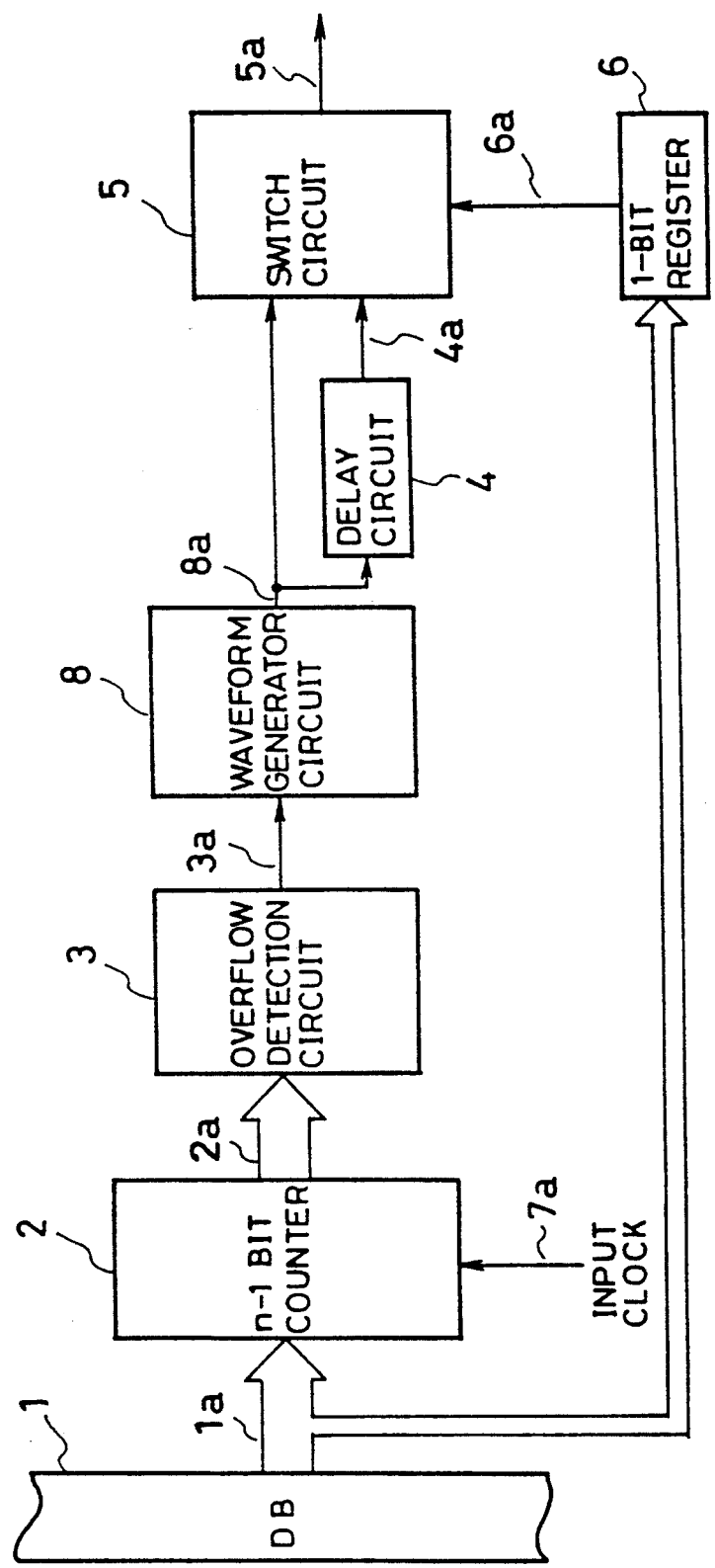
FIG. 4 is a block diagram of a timer circuit according to the second embodiment of the present invention.
Figure 5:
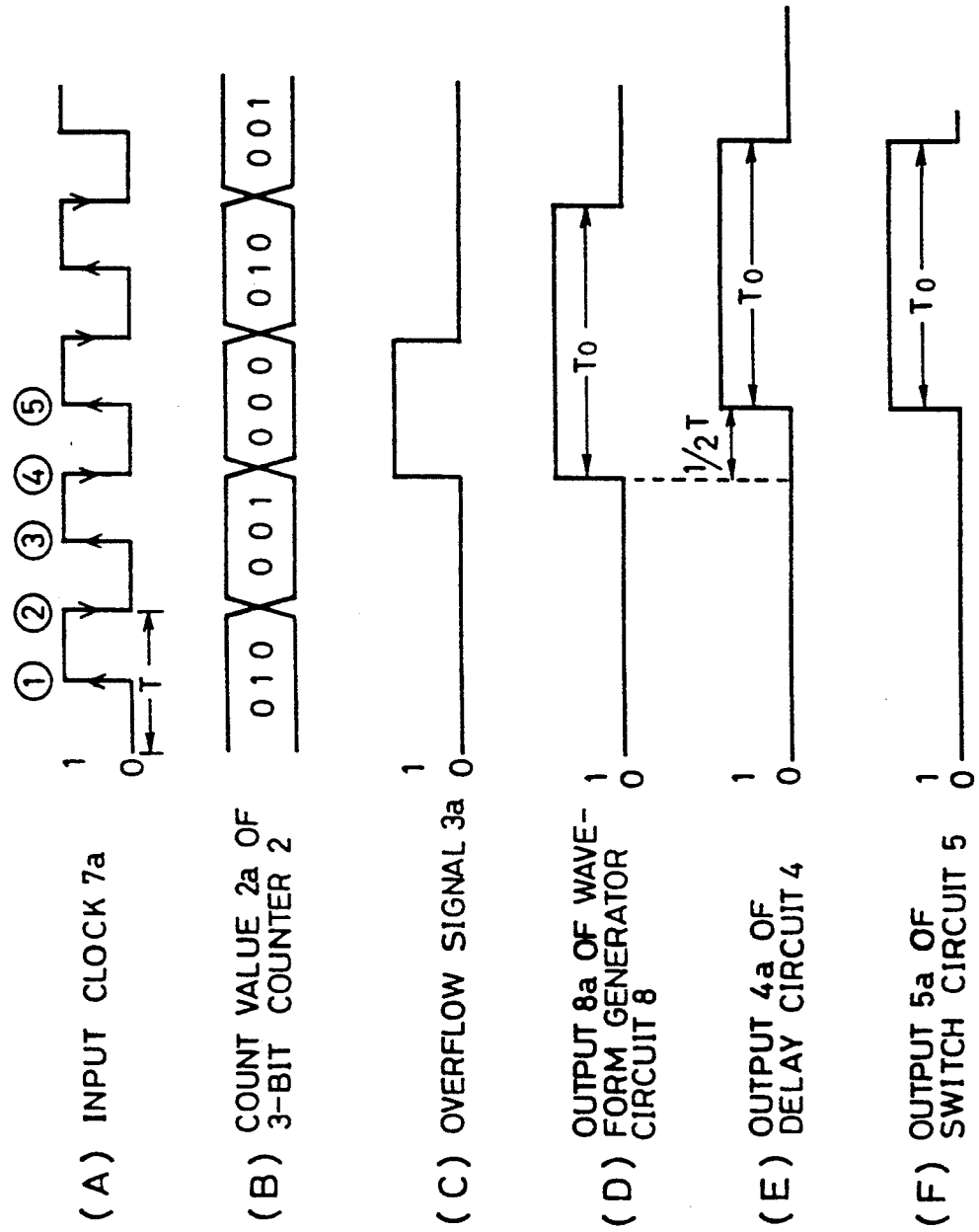
FIG. 5 is a waveform diagram illustrating the operation of each part of the timer circuit shown in FIG. 4.

FIG. 4 is a block diagram of the second embodiment of the present invention. In the figure, reference numeral 8 represents a waveform generator circuit and other elements are the same as the first embodiment. FIG. 5 is a waveform diagram illustrating the operation of each part of the timer circuit of the second embodiment when the same 4-bit input count value as FIG. 3 is inputted. Reference letter (A) represents an input clock 7a inputted into the n−1 bit counter 2 (B) a count value of the n−1 bit counter 2 (3-bit counter 2 in this case), (C) an overflow signal 3a from the overflow detection circuit 3, (D) an output signal 8a of the waveform generator circuit 8, (E) an output signal 4a of the delay circuit 4, and (F) an output signal of the switch circuit 5. The waveform generator circuit 8 outputs a signal having a cycle T0, for example ((D) of FIG. 5), in response to the overflow signal 3a from the overflow detection circuit 3. As a matter of course, the waveform generator circuit 8 may output a signal which changes from "1" to "0" or from "0" to "1" in a predetermined period of time. In this second embodiment, the overflow signal is not delayed, but the output waveform signal generated by the waveform generator circuit 8 in response to the overflow signal is delayed by the delay circuit unlike the first embodiment. The operation of this embodiment is almost the same as that of the first embodiment, and accordingly, its description is omitted.

As described in the foregoing, according to the first embodiment of the present invention, since the minimum decomposition width of the overflow signal detected from the timer circuit is reduced to half the cycle of the input clock, the minimum decomposition width of the overflow signal can be reduced to half that of the conventional timer circuit without changing the frequency of the input clock.

According to this second embodiment of the invention, since the minimum decomposition width of the waveform signal outputted from the waveform output means of the timer circuit is reduced to half the cycle of the input clock, the minimum decomposition width of the waveform signal can be reduced to half that of the conventional timer circuit without changing the frequency of the input clock.

What is claimed is:

1. A timer circuit having an overflow detection circuit for detecting an overflow of a counter to which a count value is set and for outputting an overflow signal comprises counter means provided before said overflow detection circuit for counting high-order n−1 bits of the set n-bit input count value in response to a predetermined input clock, bit storage means for storing a low-order one bit of the input count value, delay means for delaying the overflow signal from said overflow detection circuit by half the cycle of the input clock, and switch means for selecting the overflow signal delayed by said delay means or the undelayed overflow signal from said overflow detection circuit according to a value stored in said bit storage means and for outputting the selected signal.

2. A timer circuit having an overflow detection circuit for detecting an overflow of a counter to which a count value is set and for outputting an overflow signal comprises counter means provided before said overflow detection circuit for counting high-order $n-1$ bits of the set n-bit input count value in response to a predetermined input clock, bit storage means for storing a low-order one bit of the input count value, waveform signal generator means for generating a predetermined waveform signal in response to the overflow signal from said overflow detection circuit, delay means for delaying the waveform signal from said waveform signal generator means by half the cycle of the input clock, and switch means for selecting the waveform signal delayed by said delay means or the undelayed waveform signal from said waveform signal generator means to a value stored in said bit storage means and for outputting the selected signal.

3. A timer circuit according to claim 1 or claim 2, wherein
said counter means consists of an $n-1$ bit counter.

4. A timer circuit according to claim 1 or claim 2, wherein
said bit storage means consists of a one-bit register.

5. A timer according to claim 1 or claim 2, wherein
said delay means consists of transmission gates and inverter circuits.

6. A timer circuit according to claim 1 or claim 2, wherein
said switch means consists of an inverter and clocked inverters and performs switch operation through control of said bit storage means.

7. A timer circuit according to claim 2, wherein
said waveform generator means outputs a signal having a predetermined cycle and including a pulse signal in response to the overflow signal.

* * * * *